(12) United States Patent
Condorelli et al.

(10) Patent No.: US 10,859,617 B2
(45) Date of Patent: Dec. 8, 2020

(54) METHOD OF OPERATING LC SENSORS, CORRESPONDING SYSTEM AND APPARATUS

(71) Applicant: STMICROELECTRONICS S.R.L., Agrate Brianza (IT)

(72) Inventors: Riccardo Condorelli, Tremestieri Etneo (IT); Daniele Mangano, San Gregorio di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 153 days.

(21) Appl. No.: 16/136,121

(22) Filed: Sep. 19, 2018

(65) Prior Publication Data

US 2019/0018051 A1    Jan. 17, 2019

Related U.S. Application Data

(62) Division of application No. 15/070,509, filed on Mar. 15, 2016, now Pat. No. 10,120,006.

(30) Foreign Application Priority Data

Sep. 10, 2015   (IT) .................. 102015000050292

(51) Int. Cl.
  *G01R 27/26* (2006.01)
  *G01D 5/20* (2006.01)
  *H03K 17/95* (2006.01)

(52) U.S. Cl.
  CPC .............. *G01R 27/26* (2013.01); *G01D 5/20* (2013.01); *H03K 17/954* (2013.01); *H03K 17/9537* (2013.01)

(58) Field of Classification Search
  CPC ................ G01R 27/2611; G01R 27/26; G01R 27/2605; G06F 3/044; G01D 5/20; H03K 17/9537; H03K 17/954
  USPC .......................................... 324/655, 658, 679
  See application file for complete search history.

(56) References Cited

U.S. PATENT DOCUMENTS

| | | | | |
|---|---|---|---|---|
| 4,001,718 A | * | 1/1977 | Wilson | G01V 3/102 331/65 |
| 4,618,835 A | * | 10/1986 | Wilson | G01V 3/102 324/207.16 |
| 4,851,770 A | * | 7/1989 | Fiori, Jr. | G01D 5/243 324/207.16 |
| 4,893,076 A | | 1/1990 | Leonard et al. | |
| 5,574,366 A | * | 11/1996 | Joost | G01B 7/023 324/207.12 |
| 5,576,628 A | | 11/1996 | Caliboso et al. | |
| 6,646,454 B2 | | 11/2003 | Watkins | |

(Continued)

*Primary Examiner* — Tung X Nguyen
*Assistant Examiner* — Robert P Alejnikov, Jr.
(74) *Attorney, Agent, or Firm* — Seed IP Law Group LLP

(57) ABSTRACT

In one embodiment, an inductive/LC sensor device includes: an energy storage device for accumulating excitation energy, an LC sensor configured to oscillate using energy accumulated in the energy storage device and transferred to the LC sensor, an energy detector for detecting the energy accumulated in the energy storage device reaching a charge threshold, and at least one switch coupled with the energy detector for terminating accumulating excitation energy in the energy storage device when the charge threshold is detected having been reached by the energy detector.

16 Claims, 3 Drawing Sheets

(56) References Cited

U.S. PATENT DOCUMENTS

| | | | |
|---|---|---|---|
| 6,836,128 B2 * | 12/2004 | Palata | G01B 7/02 |
| | | | 324/654 |
| 7,511,476 B2 * | 3/2009 | Taylor | G01D 5/243 |
| | | | 324/207.15 |
| 7,528,597 B2 * | 5/2009 | Taylor | F01L 9/04 |
| | | | 324/207.15 |
| 9,479,165 B2 * | 10/2016 | Kuehn | H03K 17/954 |
| 2005/0212510 A1 * | 9/2005 | Kirchdoerffer | H03K 17/9537 |
| | | | 324/207.15 |
| 2008/0204206 A1 | 8/2008 | Frohler | |

* cited by examiner

METHOD OF OPERATING LC SENSORS, CORRESPONDING SYSTEM AND APPARATUS

BACKGROUND

Technical Field

The description relates to inductive (LC) sensors.

One or more embodiments may apply to LC sensors for use, e.g., in fluid metering applications, such as water and gas meters.

Description of the Related Art

Inductive sensing is based on an inductor-capacitor resonant circuit (which explains the current designation of "LC sensing") which is pumped by an oscillator with the inductor acting as a sensing coil. As a conductive (e.g., metal) object comes in the vicinity of the coil, currents are generated in the object depending on various parameters such as, e.g., the material and dimensions of the object and/or the distance to the sensing coil. The currents thus generated form a magnetic field which reduces the oscillation amplitude of the resonant circuit (tank) thus changing the parallel resonance impedance of the circuit. Detecting/measuring such change may be exploited for various sensing purposes.

Inductive/LC sensing may be used in various industrial fields for, e.g., various types of contactless sensing of moving parts for various purposes such as detecting/measuring distance, speed or flow.

For instance, inductive/LC sensing is being increasingly applied, e.g., in water and gas meter applications with the possibility of offering power/efficient solution adapted to be directly embedded, e.g., in microcontroller units—MCUs.

In such a possible context of use, factors such as, e.g., reducing the number of (analog) components coupled with the sensor, facilitating digital processing of the sensing signals and simplifying control logic while providing reduced consumption may play a significant role.

Reducing the time involved in performing a certain measurement and/or the capability of handling multiple sensors represent a further factors of interest.

Time-based LC sensor excitation using, e.g., a high-speed (e.g., 4 MHz) clock source to control transfer of energy during excitation has been used with potential drawbacks represented, e.g., by power consumption and total measurement times in the range of, e.g., 50 microseconds.

BRIEF SUMMARY

One or more embodiments are directed to a method that includes accumulating excitation energy for an inductive-capacitive (LC) sensor, oscillating the LC sensor using the excitation energy accumulated, detecting the excitation energy accumulated reaching a charge threshold, and terminating accumulating the excitation energy for the LC sensor in response to detecting the excitation energy accumulated reaching the charge threshold.

One or more embodiments also relate to a corresponding system as well as to apparatus (e.g., metering device such as a water or gas meter) including such a system.

The claims are an integral part of the disclosure of one or more embodiments as provided herein.

One or more embodiments may offer one or more of the following advantages:

reduce the power absorption (no high-speed clock needed)

insensitivity to Power Voltage-Temperature—PVT factors, (due to the possibility of resorting to closed-loop control), robustness against PVT variations also in the field, that is in current operation.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
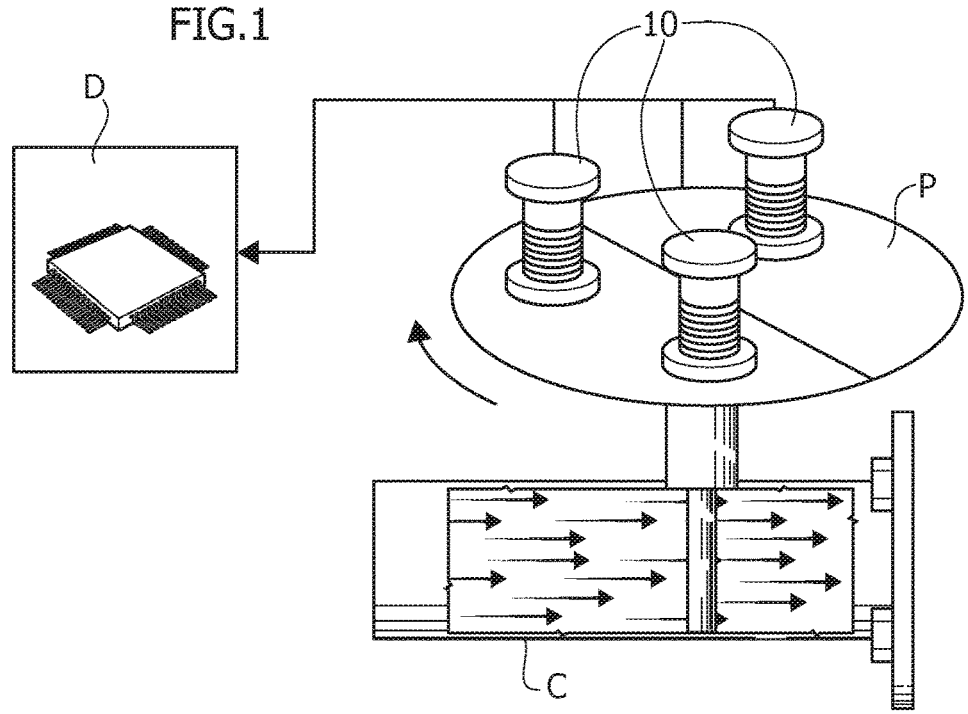
FIG. 1 is a generally representative of a possible context of use of one or more embodiments.

The schematic diagram of FIG. 1 is generally exemplary of possible applications of inductive/LC sensing: these designations will be hereinafter used as synonyms having regard to the general principle of operation of such sensors as summarized in the introduction of this description.

The schematic diagram of FIG. 1 is exemplary of a possible application of inductive/LC sensors 10 in a fluid metering device such as a flow-meter (e.g., water or gas meter) in order to detect/measure fluid flow in a conduit C. This may take place, in manner known per se, by detecting/measuring movement of a rotary sensing plate P which is driven in rotation by fluid flow in the conduit C.

For instance, the rotary plate P may include complementary portions of different materials (e.g., conductive and non-conductive). One or more LC sensors 10 arranged facing the plate P may thus produce signals indicative of rotation of the plate P (and thus of the flow in the conduit C) for processing in a controller, e.g., a microcontroller unit—MCU.

The general principles underlying the structure and operation of such metering device are otherwise known in the art, which makes it unnecessary to provide a more detailed description herein. Also, it will be appreciated that the application exemplified in FIG. 1 is just one of a wide variety of possible applications of inductive/LC sensor 10, one or more embodiments being otherwise primarily concerned with managing operation of such an LC sensor.

In one or more embodiments, operation of an LC sensor 10 as exemplified herein may generally involve at least one charging phase wherein excitation energy for the sensor 10 is accumulated. The LC sensor (here exemplified as the parallel connection of an inductor $L_s$ and a capacitor $C_s$) may thus oscillate energized by the energy accumulated to permit sensing to take place as outlined in the introduction to this description.

In conventional solutions, energy accumulation (charging) may be stopped at a certain time as defined, e.g., by a high-frequency (e.g., 4 MHz clock source).

By way of contrast, one or more embodiments as exemplified herein may provide for detecting (e.g., by a charge sensor/energy meter 12) the fact that the energy accumulated has reached a certain charge accumulation threshold, with operation switched towards the sensing phase when the charge threshold is detected to be reached.

Figure 2:
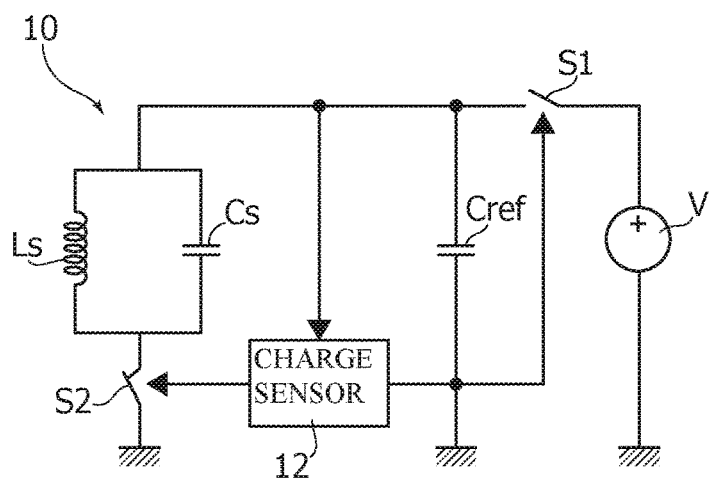
FIG. 2 is a block diagram exemplary of embodiments.

In one or more embodiments as exemplified in FIG. 2 the excitation energy from an electric energy source V (of any known type for that purpose) may be accumulated by charging a reference capacitor $C_{ref}$.

One or more embodiments as exemplified in FIG. 2 may include a first switch S1 and a second switch S2 (e.g., electronic switches such as MOSFETs) switchable under the control of the energy meter 12 configured for sensing the charge on the reference capacitor $C_{ref}$ (e.g., the voltage across the reference capacitor $C_{ref}$).

When the switch S1 is closed, that is conductive, the reference capacitor $C_{ref}$ is set between the source V and ground, and the sensor 10 may be set between the source V and the switch S2, with the switch S2 set between the sensor 10 and ground.

In one or more embodiments, operation of the circuit layout exemplified in FIG. 2 may include:

pre-charge of $C_{ref}$: S2 is open—that is non-conductive—so that the sensor 10 is "floating" with respect to ground, and S1 is closed—that is conductive—until the voltage on $C_{ref}$ reaches a value $VC_{ref\_INIT}$ (<=V) with S1 subsequently open—that is non-conductive;

energy transfer: S1 is open and S2 is closed, so that the energy accumulated on $C_{ref}$ is (partially) transferred onto the sensor 10 (which is substantially in parallel to $C_{ref}$). Controlled transfer of energy terminates when the voltage across $C_{ref}$ reaches a final target value $VC_{ref\_FIN}$, after which the switch S2 is opened. In that way, the amount of energy transferred is (ideally) equal to $0.5\, C_{ref}(VC_{ref\_INIT} - VC_{ref\_FIN})^2$;

measurement: both S1 and S2 are open. The sensor will start oscillating around the voltage value $VC_{ref\_FIN}$, with such oscillation adapted to be monitored via the pin towards the switch S2.

The circuit may then be reset and the sequence exemplified in the foregoing repeated for a new measurement.

Figure 3:
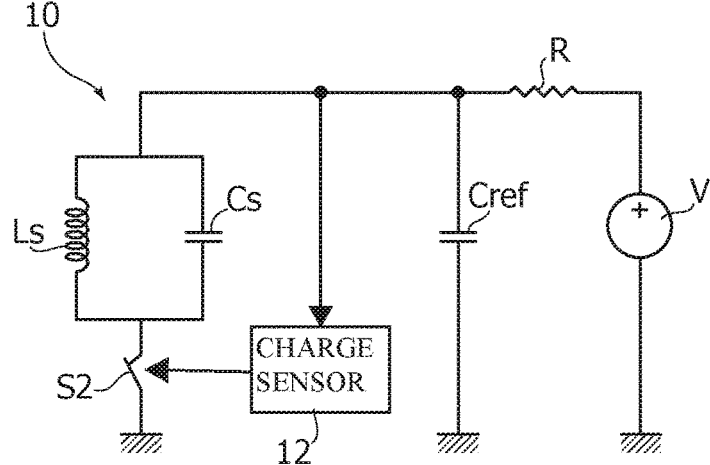
FIG. 3 is a another block diagram exemplary of embodiments.

FIG. 3 is exemplary of the possibility of implementing a similar mode of operation in an arrangement where the inner resistance R of the source (generator) V may play the role of the switch S1, by assuming that the time constant $T=R*C_{ref}$ is much higher than the time needed for performing the measurement, which is reasonably the case if, e.g., the internal pull-up of the address data bus or PAD of microcontroller D is used as the voltage generator V.

In one or more embodiments, operation of the circuit layout exemplified in FIG. 3 may again include:

pre-charge of $C_{ref}$: S2 is open and the energy meter 12 monitors that $C_{ref}$ is charged to an energy accumulation threshold voltage, e.g., V;

energy transfer: S2 is closed and the energy accumulated on $C_{ref}$ is partially transferred onto the sensor 10. Controlled transfer of energy terminates when the voltage across $C_{ref}$ reaches a final target value $VC_{REF\_FIN}$, after which the switch S2 is opened. In that way, the amount of energy transferred is (ideally) equal to $0.5\, C_{ref}(V\_VC_{ref\_FIN})^2$. The energy from the generator may be neglected due to the high value of the time constant.

measurement: S2 is open. The sensor will start oscillating around the voltage value $VC_{ref\_FIN}$, with such oscillation adapted to be monitored via the pin towards the switch S2. The voltage variation on $C_{ref}$ due to re-charging via the generator V may again be neglected due to the time constant $T=R*C_{ref}$ being much higher than the time needed for performing the measurement.

Figure 4:
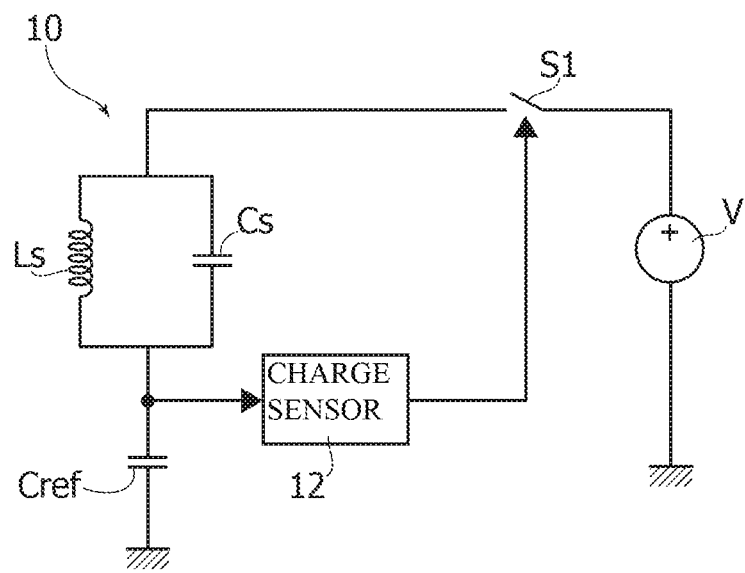
FIG. 4 is a further block diagram exemplary of embodiments.

In one or more embodiments as exemplified in FIG. 4 a reference capacitor $C_{ref}$ may again be used, by coupling it in series with the LC sensor 10, with the series connection of the sensor 10 and the reference capacitor $C_{ref}$ set between a switch S1 (again an electronic switch such as a MOSFET: the same designation of FIG. 2 is used for simplicity) and ground with the reference capacitor $C_{ref}$ between the sensor 10 and ground.

In one or more embodiments as exemplified in FIG. 4, an energy sensing meter 12 may again be provided capable of sensing the charge on the reference capacitor $C_{ref}$ (e.g., the voltage across the reference capacitor $C_{ref}$) and driving the switch S1 which is arranged between the source V and the sensor 10.

In one or more embodiments as exemplified in FIG. 4, the switch S1 between the source V and the sensor 10 may be closed (that is, conductive) while energy is being accumulated on the reference capacitor $C_{ref}$ via the sensor 10. When a certain charge threshold is detected to be reached (as dictated by the characteristics and intended mode of operation of the sensor) on the reference capacitor $C_{ref}$ the energy meter 12 may open the switch S1.

In one or more embodiments, operation as described above may involve both excitation of the sensor 10 and charging the capacitor $C_{ref}$ (that is the sensor 10 is excited by the current flowing through $C_{ref}$).

Such a charging/excitation process terminates when the charge, that is the voltage on $C_{ref}$ reaches a target threshold value.

By way of reference to the exemplary layouts of FIGS. 2 and 3, the arrangement exemplified in FIG. 4 may be regarded as somewhat joining pre-charge and energy transfer (charge sharing) with excitation of the sensor and generation of the voltage $C_{ref}$ about which oscillation will occur taking place in a single step.

In one or more embodiments as exemplified in FIG. 4 measurement may involve opening the switch S1, with the sensor 10 starting oscillating about the value of the voltage charged onto $C_{ref}$ and the pin towards S1 (which remains floating since S1 is open) adapted to be used for monitoring the (damped) oscillation, with $C_{ref}$ primarily providing a reference for the voltage about which sensor oscillation will take place.

The circuit may then be reset and the sequence exemplified in the foregoing repeated for a new measurement.

Figure 5:
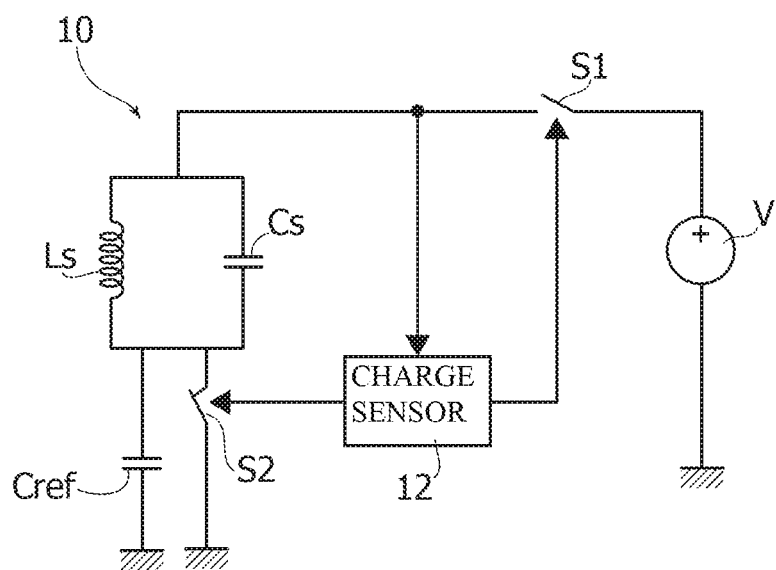
FIG. 5 is a another further block diagram exemplary of embodiments.

FIG. 5 is exemplary of the possibility of implementing a similar mode of operation by making sensor excitation independent of generation of the oscillation voltage on $C_{ref}$.

In comparison with the exemplary circuit layout of FIG. 4, the exemplary circuit layout of FIG. 5 involves:

a second switch S2 (again an electronic switch such as a MOSFET: the same designation of FIGS. 2 and 3 is used for simplicity) set between the sensor 10 and ground, that is in parallel to the capacitor $C_{ref}$;

the energy meter 12 configured for driving the switches S1 and S2 as a function of the voltage at a point between the switch S1 and the sensor 10.

In one or more embodiments, operation of the circuit layout exemplified in FIG. 5 may include:

excitation: S1, S2 both closed, with the sensor 10 set between the voltage V and ground. The energy meter 12 is sensitive to the amount of energy transferred; $C_{ref}$ kept uncharged as it is grounded on both sides;

post excitation and generation of Vref: S1 closed and S2 open. Charging of the sensor 10 is completed and the capacitor $C_{ref}$ is charged to a final value $VC_{re\_FIN}$;

measurement: S1 and S2 both open, with the sensor oscillation about the voltage $VC_{ref\_FIN}$, and oscillation adapted to be monitored on the "floating" pin of the switch S1 opposed to the source V.

Various other implementations are feasible in one or more embodiments.

Just to mention one possibility, in one or more embodiments, the switch S2 may connect directly $C_{ref}$ to the generator V, so that $VC_{ref\_FIN}$ may be generated directly instead of via the sensor 10.

Figure 6:
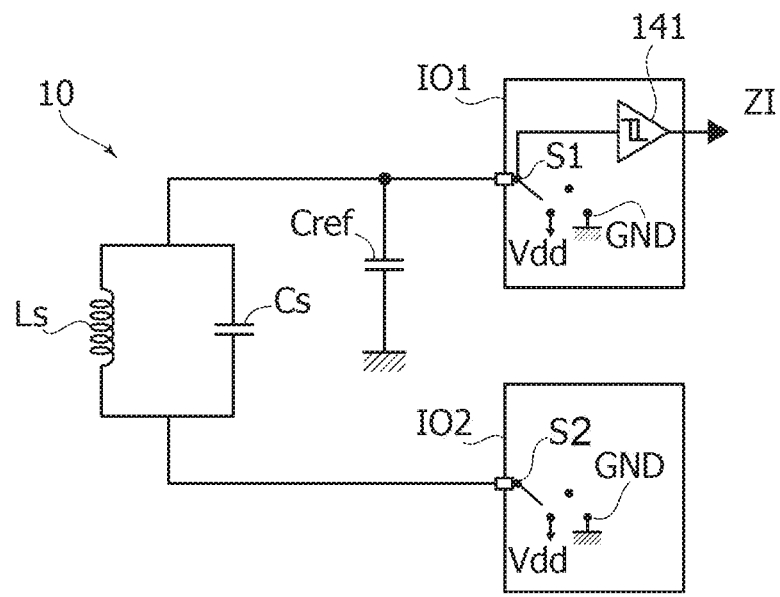
FIGS. 6 and 7 are schematic diagrams exemplary of circuit layouts according to one or more embodiments.
Figure 7:
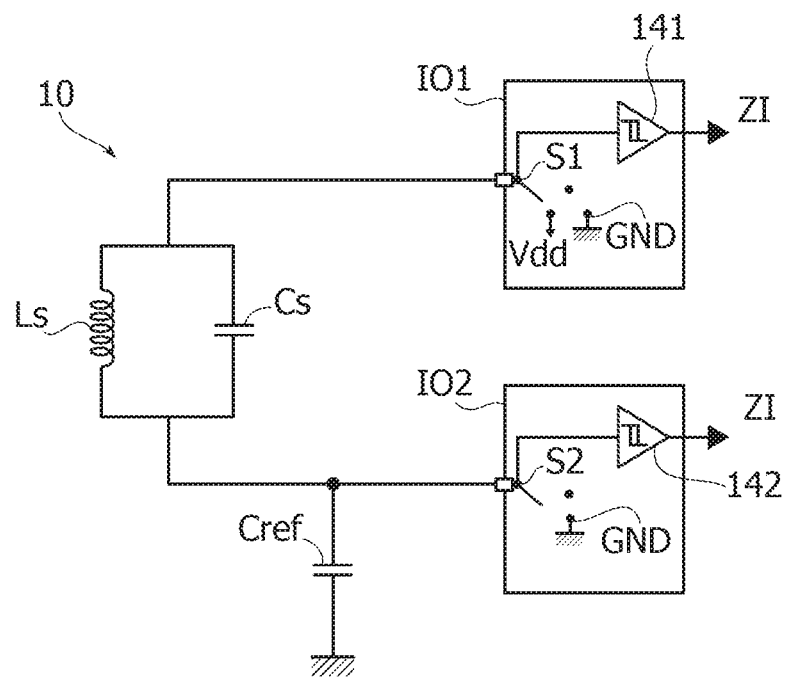

The circuit diagrams of FIGS. 6 and 7 provide further details of possible embodiments along the lines of FIGS. 2-3 and 4-5, wherein the I/O PADs of, e.g., a microcontroller such as D in FIG. 1 may include internal switches S1, S2 (possibly admitting connection to a source Vdd, to ground GND and "open", e.g., floating) as well as Schmitt triggers 141, 142. In the discussion that follows, the microcontroller controls the switches S1, S2 based in part on the inputs ZI provided by the Schmitt triggers 141, 142.

In FIGS. 6 and 7 the same reference symbols are used to denote parts of elements already introduced in connection with FIGS. 2 to 5 without repeating the related description for the sake of brevity.

The circuit diagrams of FIGS. 6 and 7 are exemplary of arrangements providing good power efficiency by resorting to "clock-less" operation where the excitation time may be controlled by the PAD's via Schmitt triggers and the capacitors Cs and $C_{ref}$, thus dispensing with high frequency clock sources, with the measurement process adapted to be driven, e.g., by a low speed real-time clock (RTC) (e.g., low-speed external (LSE) clock) that has the basic task of triggering new measurements.

The circuit diagrams of FIGS. 6 and 7 are exemplary of two implementation schemes:

a clock-less charge sharing scheme, including a pre-charge step where a reference capacitor $C_{ref}$ is preloaded by a PAD IO1 with a maximum voltage (Vdd) and a second step where the accumulated energy is transferred to the sensor 10 to excite and generate the reference voltage on $C_{ref}$ (FIG. 6); and a clock-less direct charge scheme, where excitation of the sensor 10 and generation of the reference voltage are driven by two PADs, e.g., IO1, IO2, with two charge steps, e.g., pre-charge and post-charge (FIG. 7).

A direct charge mechanism may permit to use a smaller $C_{ref}$ with respect to a charge-sharing scheme.

In one or more embodiments as exemplified in FIG. 6, the sensor 10 will be charged by means of a controlled transfer of charge from $C_{ref}$. In this case $C_{ref}$ may be selected with a capacity large enough to store an adequate amount of charge for exciting the sensor 10 and to hold a residual energy in the capacitor (Vmid voltage).

One or more embodiments as exemplified in FIG. 6 may involve two different charge steps: in the former $C_{ref}$ is fully loaded at Vdd and in the latter the accumulated energy is transferred to the sensor 10.

In one or more embodiments, operation of an arrangement as exemplified in FIG. 6 may involve the following steps performed to complete a measurement stage:

reset and pre-charge: both switches S1 and S2 are closed to Vdd, the sensor 10 will be discharged while $C_{ref}$ is precharged to Vdd. The residual energy in the capacitor (Vmid voltage) is held and used as starting point for this step;

charge sharing: the switch S1 is open while the switch S2 is closed to GND. With this configuration $C_{ref}$ provides the energy required to load the sensor 10. This step will be completed when the trigger IO1 (ZI input) reaches a logic "0" (with the IO1 voltage at VthL). The amount of transferred energy is $0.5\ C_{ref}(Vdd-Vthl)^2$;

sensor oscillation: both switches S1 and S2 are open and the oscillation may be monitored via the IO2/ZI pin.

In fact, the voltage Vmid=VthL about which oscillation takes place may be present on IO1 while VIO2=Vsensor+ VIO1=>VIO2=(Vsensor+VthL)/ZI pin.

In the arrangement exemplified in FIG. 7, a single sensor 10 may be set between two PADs IO1 and IO2: in one or more embodiments, that configuration may be extended to cover multiple sensors 10 both in 4 PAD or 6 PAD configurations).

In one or more embodiments as exemplified in FIG. 7, the PAD IO1 may have two main tasks:

providing the current to charge/reset the sensor 10 and $C_{ref}$;

triggering the start of the post-charge phase (IO1 Schmitt trigger 141).

In one or more embodiments as exemplified in FIG. 7, the PAD IO2 may have the following main tasks:

discharging the sensor 10 during a reset state;

triggering the end of a post-charge phase looking at its voltage level (Schmitt trigger 142);

tuning and controlling the voltage on $C_{ref}$ during the oscillation time.

In one or more embodiments, operation of an arrangement as exemplified in FIG. 7 may involve the following steps performed to complete a measurement stage:

reset: switch S1 and switch S2 are closed to GND, both the sensor 10 and the capacitance $C_{ref}$ are shorted to GND;

pre-charge: the switch S1 is closed to Vdd while the switch S2 is closed to GND. In this initial phase the inductor Ls can be assumed to be an open circuit for an exemplary sensor 10, with the capacitor Cs set between Vdd and GND and $C_{ref}$ connected to GND, so that the sensor capacitor Cs will be charged; the pre-charge duration will be completed when the IO1 trigger (ZI input) reaches, e.g., a "1" logic level, with Cs pre-charged to a value VthH so that the energy transferred to the sensor 10 is $0.5\ Cs\ VthH^2$;

post-charge: the switch S1 is closed to Vdd while the switch S2 is open (high impedance). In this step sensor excitation will be completed and the reference voltage on $C_{ref}$ generated. The post-charge will be completed when the IO2 trigger (ZI input) will reach a "1" logic level. At the end of this step $C_{ref}$ will be pre-charged to VthH and the sensor fully charged. For high values of $C_{ref}$ the sensor inductor current may not be negligible, and the PAD IO1 will provide both the energy for the inductor Ls plus the energy for $C_{ref}$;

Vref range stabilization and oscillation measure: when the IO2 voltage reaches VthH, the switch S1 will be open (end of post-charge step) while the switch S2 will be configured to keep the IO2 voltage below VthH: the PAD will drive a logic "0" (PullDown or PushPull depending of register configuration) any time that the IO2/ZI is one. The IO2 configuration ensures that the $C_{ref}$ voltage is kept below the VthH voltage value: for instance, for 5 Volt-tolerant PADs there are some parasitic effects (diode) that may increase the Vref voltage during oscillation of the sensors 10 in case this goes below GND. The dumped oscillation will be observed by the IO1/ZI pin.

In one or more embodiments exemplifies herein, the final part of the smooth oscillation may cross the trigger threshold (Vth) with a reduced slope, which may expose the device at the noise: some extra pulse can be generated if a noise with a sufficient amplitude occurs near the Vth crossing. In one or more embodiments, noise immunity may be pursued by reducing the time over which the smooth oscillation is near the Vth threshold. In one or more embodiments that result may be achieved by moving the detection phase near the first phase of the oscillation where the slope of the waveform is sharpest and/or by moving dynamically the Vmid voltage during the measurement time.

The first solution may be applied by reducing the Vmid voltage value. For a clock-less charge-sharing solution as exemplified in FIG. 6 one may activate the PD on the PAD IO2 to decrease the Vmid voltage during the oscillation. A register may be used to select how many pulses are counted before the PD is enabled, and a register may be similarly used to enable the dynamic PD feature. For a clock-less solution as exemplified in FIG. 7, during the Vref range stabilization step the IO2/ZI feedback can be "stretched" to reduce the Vmid voltage with a programmable delay (e.g., a register).

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An LC sensor device, comprising:
   an energy storage device configured to accumulate excitation energy,
   an LC sensor coupled to the energy storage device and configured to oscillate when energized by the excitation energy from the energy storage device,
   an energy detector configured to detect the excitation energy in the energy storage device reaching a charge threshold,
   a first switch configured to selectively couple the LC sensor with an energy source; and
   a second switch connected in series with the LC sensor and positioned between the LC sensor and a ground terminal and being configured to be controlled by the energy detector.

2. The LC sensor device of claim 1, wherein the energy storage device includes a reference capacitor coupled in parallel to the series connection of the LC sensor and the second switch.

3. The LC sensor device of claim 1, wherein the second switch is coupled in series to the LC sensor and the energy storage device includes a reference capacitor coupled in parallel with a combination of the LC sensor and the second switch.

4. The LC sensor device of claim 1, wherein:
   the energy storage device includes a reference capacitor coupled in series to the LC sensor, and
   the energy detector is configured close the first switch to electrically couple the LC sensor to the energy source and open the second switch to remove a short-circuit across the reference capacitor while the LC sensor is electrically coupled to the energy source by the first switch.

5. The LC sensor device of claim 1, wherein:
   the energy storage device includes a reference capacitor, and
   the energy detector is configured to detect the energy accumulated reaching the charge threshold by detecting a voltage across the reference capacitor reaching a voltage threshold.

6. The LC sensor device of claim 1, wherein when the first and second switches are open there is a zero-voltage drop across the LC sensor.

7. The LC sensor device of claim 1, wherein at least one of the energy detector, the first switch, and the second switch is controlled by a controller unit.

8. The LC sensor device of claim 1, wherein the energy detector includes a Schmitt trigger configured to detect the excitation energy in the energy storage device reaching the charge threshold, the LC sensor device including a microcontroller configured to control the first and second switches based on an output of the Schmitt trigger.

9. A method comprising:
   electrically coupling an energy storage device to an energy source via a first switch;
   accumulating excitation energy in the energy storage device while the energy storage device is electrically coupled to the energy source by the first switch;
   detecting the excitation energy accumulated reaching a charge threshold;
   opening the first switch in response to detecting the excitation energy accumulated reaching the charge threshold; and
   oscillating an LC sensor, while the first switch is open, using the excitation energy accumulated by the energy storage device, wherein:
   the accumulating includes accumulating the excitation energy while the energy storage device is electrically coupled to the energy source via a closed second switch and the first switch, the method includes transferring charge from the energy storage device to the LC sensor while the first switch is open and the second switch electrically couples the LC sensor to ground, and the oscillating includes oscillating the LC sensor in response to opening the second switch in response to detecting the excitation energy accumulated reaching the charge threshold.

10. The method of claim 9, wherein:
the accumulating includes:
a first charge phase in which the closed second switch electrically couples the LC sensor to the ground while the first switch electrically couples the energy storage device to the energy source; and
a second charge phase in which the second switch is open while the first switch electrically couples the energy storage device to the energy source; and
the oscillating includes oscillating the LC sensor in response to opening the first switch in response to detecting the excitation energy accumulated reaching the charge threshold.

11. An LC sensor device, comprising:
an energy storage device configured to accumulate excitation energy,
an LC sensor coupled to the energy storage device and configured to oscillate when energized by the excitation energy in the energy storage device,
an energy detector configured to detect the excitation energy in the energy storage device reaching a charge threshold,
a first switch coupled with the energy detector and configured to electrically couple the LC sensor with an energy source and cause the excitation energy to be transferred from the energy source to the energy storage device while the first switch is closed, wherein the energy detector is configured to open the first switch in response to detecting that the charge threshold has been reached by the excitation energy in the energy storage device, wherein the LC sensor is configured to oscillate while the first switch is open, and
a second switch connected in series with the LC sensor and positioned between the LC sensor and a ground terminal, the second switch being configured to be controlled by the energy detector.

12. The LC sensor device of claim 11, wherein:
the energy storage device includes a reference capacitor.

13. The LC sensor device of claim 11, wherein the second switch is coupled in series to the LC sensor and the energy storage device includes a reference capacitor coupled in parallel with a combination of the LC sensor and the second switch.

14. The LC sensor device of claim 13, wherein the energy detector includes a Schmitt trigger configured to detect the excitation energy in the energy storage device reaching the charge threshold, the LC sensor device including a microcontroller configured to control the first and second switches based on an output of the Schmitt trigger.

15. A fluid flow sensing device, comprising:
a sense structure configured to be moved by a fluid flow; and
an LC sensor device coupled to the sense structure and configured to sense movement of the sense structure, the LC sensor including:
an energy storage device configured to accumulate excitation energy,
an LC sensor coupled to the energy storage device and configured to oscillate when energized by the excitation energy in the energy storage device,
an energy detector configured to detect the excitation energy in the energy storage device reaching a charge threshold,
a first switch coupled with the energy detector and configured to electrically couple the LC sensor with an energy source and cause the excitation energy to be transferred from the energy source to the energy storage device while the first switch is closed, wherein the energy detector is configured to open the first switch in response to detecting that the charge threshold has been reached by the excitation energy in the energy storage device, wherein the LC sensor is configured to oscillate while the first switch is open, and
a second switch connected in series with the LC sensor and positioned between the LC sensor and a ground terminal, the second switch being configured to be controlled by the energy detector.

16. The LC sensor device of claim 15, wherein the energy detector includes a Schmitt trigger configured to detect the excitation energy in the energy storage device reaching the charge threshold, the LC sensor device including a microcontroller configured to control the first and second switches based on an output of the Schmitt trigger.

* * * * *